United States Patent [19]
Hemmi et al.

[11] Patent Number: 5,615,124
[45] Date of Patent: Mar. 25, 1997

[54] AUTONOMOUS EVOLUTION TYPE HARDWARE DESIGN SYSTEM

[75] Inventors: Hitoshi Hemmi; Junichi Mizoguchi; Katsunori Shimohara, all of Kyoto, Japan

[73] Assignee: ATR Human Information Processing Research Laboratories, Kyoto, Japan

[21] Appl. No.: 337,020

[22] Filed: Nov. 7, 1994

[30] Foreign Application Priority Data

Dec. 13, 1993 [JP] Japan ................................. 5-311724

[51] Int. Cl.$^6$ ................................................ G06F 17/50
[52] U.S. Cl. ................................... 364/488; 364/490
[58] Field of Search ............................ 364/488, 489, 364/490, 491, 468, 474.24

[56] References Cited

U.S. PATENT DOCUMENTS

| 5,224,056 | 6/1993 | Chene et al. ............................ 364/490 |
| 5,465,218 | 11/1995 | Handa ................................... 364/489 |
| 5,495,419 | 2/1996 | Rostoker et al. ....................... 364/468 |
| 5,510,995 | 4/1996 | Oliver ................................ 364/474.24 |
| 5,513,124 | 4/1996 | Trimberger et al. .................... 364/491 |

OTHER PUBLICATIONS

"Production Genetic Algorithms for Automated Hardware Design Through an Evolutionary Process", by Mizoguchi et al, IEEE, Evolutionary Computation, 1994 Conference, Apr. 1994, pp. 661–664.

"Flight: A Novel Approach to the High–Level Synthesis of Digi–Serial Digital Filters", by J. Satyanarayana and B. Nowrouzian, IEEE, Circuits and Systems, 1994 Midwest Symposium, May 1995, pp. 335–338.

"Genetic Algorithms", by D. Horrocks and M. Spittle, IEE Colloq. (1992) No. 037: Circuit Theory and DSP.

"A Genetic Approach to Standard Cell Placement Using Meta–Genetic Parameter Optimization", by K. Shahookar and P. Mazumder, IEEE Transactions on Computer–Aided Design, vol. 9, No. 5, May 1990, pp. 500–511.

"Wolverines: Standard Cell Placement on a Network of Workstations", by S. Mohan and P. Mazumder, IEEE Transactions on Comuter–Aided Design of Integrated Circuits and Systems, vol. 12, No. 9, Sep. 1993, pp. 1312–1326.

"Wolverines: Standard Cell Placement on a Network of Workstations", by S. Mohan and P. Mazumder, IEEE, European (Hamburg) Design Automation Conference, Aug. 1992, pp. 46–51.

Proceedings of the Fifth International Conference on Generic Algorithms, "Genetic Algorithms for Optimization of Integrated Circuits Synthesis", by Raul San Martin et al., Jul. 17–21, 1993, pp. 432–438.

30th Design Automation Conference, "High–Level Transformations for Minimizing Syntactic Variances", by Viraphol Chaiyakul et al., Jun. 14–18, 1993, pp. 413–418.

*Primary Examiner*—Kevin J. Teska
*Assistant Examiner*—Russell W. Frejd
*Attorney, Agent, or Firm*—Lowe, Price, LeBlanc & Becker

[57] ABSTRACT

When information representing an application problem is entered from an input unit, a hardware specification interpretation unit calculates an operation result representing how the consequent hardware operates with respect to the application problem according to the information representing the application problem and the hardware specification description provided from the hardware specification description unit. A fitness calculation unit calculates a fitness representing how much the calculated operation result fits the application problem. A description modification unit modifies the current hardware specification description on the basis of a fitness evaluation which is the calculation result.

6 Claims, 4 Drawing Sheets

```
COMPONENT DECLARATION BEGIN
    INPUT TERMINAL          in 1;
    OUTPUT TERMINAL         out 1;

REGISTER                counter;
    MODEL    INCREMENT      incr 1;
COMPONENT DECLARATION END OPERATION DEFINITION BEGIN
    counter = in 1;
    counter = incr 1(counter);
    out 1 = counter;
OPERATION DEFINITION END
```

AUTONOMOUS EVOLUTION TYPE HARDWARE DESIGN SYSTEM

BACKGROUND OF THE INVENTION

1. Field of the Invention

The present invention relates to an autonomous evolution type hardware design system. More particularly, the present invention relates to an autonomous evolution type hardware design system in which a hardware specification is autonomously evolved and adapted according to its object of usage without manual hardware designing.

2. Description of the Background Art

The application range of electronic circuits has increased as large scale integrated circuit (LSI) technology advances, giving rise to the need of various types of hardwares of high circuit complexity. Since it is almost impossible to design such a complex hardware entirely by hand, various computer-aided design (CAD) systems have been developed.

FIG. 6 is a block diagram of an example of such a CAD system. In the design operation using the system of FIG. 6, the designer first enters a hardware description language (HDL) program via an input unit 21 to describe operations of circuitry. The source entered is stored in HDL source 22. HDL is only one way of example of describing the operation of circuitry, and various HDLs can be considered such as an HDL describing the connection of a transistor circuit, an HDL describing a netlist of a logic gate, and an HDL describing a hardware specification of a level higher than the circuit operation.

The circuit description stored in HDL source 22 is provided to a simulator 23 where grammatical description error is checked. Next, confirmation is made whether the described circuit carries out an operation as expected with respect to an input signal by simulation. Then, the description of the circuit is provided to a synthesizer 24 where circuit diagram data 25 or mask pattern data 26 for LSI manufacturing is produced by a synthesizer program.

Description of circuitry using an HDL must be first carried out manually even if the CAD system of FIG. 6 is used. Description of circuitry adaptable for its object of usage by means of an HDL requires training and skill.

In general, there are many ways of describing circuitry by HDL that carries out an operation applicable to its object of usage. Particularly, when the architecture thereof differs from each other, the form of description varies extensively. The eventual circuits differing in description often have a great difference in its performance such as response speed even when its operation is identical. There is generally no way of identifying which architecture is most superior since this depends upon the content of the input signal. Even a skilled designer cannot easily determine the most superior architecture.

Regarding the problem of selecting an appropriate architecture, there is only the method of carrying out computer simulation on the basis of a plurality of design examples prepared in advance, or to actually manufacture an LSI circuit and use it under real environment to compare the performance thereof.

Since great man power is required in designing even if a CAD system is used, only one type, or few types at most, of design examples can be prepared. Instead of designing an optimum circuit, a circuit that operates is provisionally produced from which the performance is to be improved depending upon the skill and experience of the designer.

SUMMARY OF THE INVENTION

In view of the foregoing, a main object of the present invention is to provide an autonomous evolution type hardware design system of high versatility that can automatically identify and produce an architecture most suited for its object of usage by producing autonomously a circuit that suits its object of usage and preparing a plurality of circuits differing in architecture.

According to the present invention, a specification of a described hardware is interpreted to generate an operation of that hardware, a fitness is calculated in using the consequent hardware on the basis of the generated hardware operation and the required operation specification, and the description of the hardware is modified by referring to the calculated fitness.

Thus, in the present invention, a hardware that carries out an operation suitable for its object of usage can be designed in an autonomous and evolutionally manner, and an optimum hardware that most suits the object of usage is obtained from a variety of architectures.

According to a preferable embodiment of the present invention, the hardware specification is expressed using a hardware description language, wherein a portion of the hardware specification description is replaced with a description grammatically equivalent to that portion.

According to the present embodiment, a meaningful specification description grammatically correct can be obtained without generating meaningless description with error in grammar.

Also, according to a preferable embodiment of the present invention, a plurality of hardware specifications are described. Description modification is carried out using genetic algorithms on the basis of the fitness of these plurality of hardware specifications.

By using genetic algorithms, a hardware specification description can be obtained speedily that suits the application problem.

Furthermore, according to a preferable embodiment of the present invention, information indicating an application problem is entered. According to this information and the specification described by the hardware specification description, an operation result is calculated representing how the actual hardware obtained by the hardware specification description operates with respect to the application problem. Then a fitness is calculated that represents the level of fitness of the operation result with respect to the application problem. The current hardware specification description is modified according to this calculation result.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
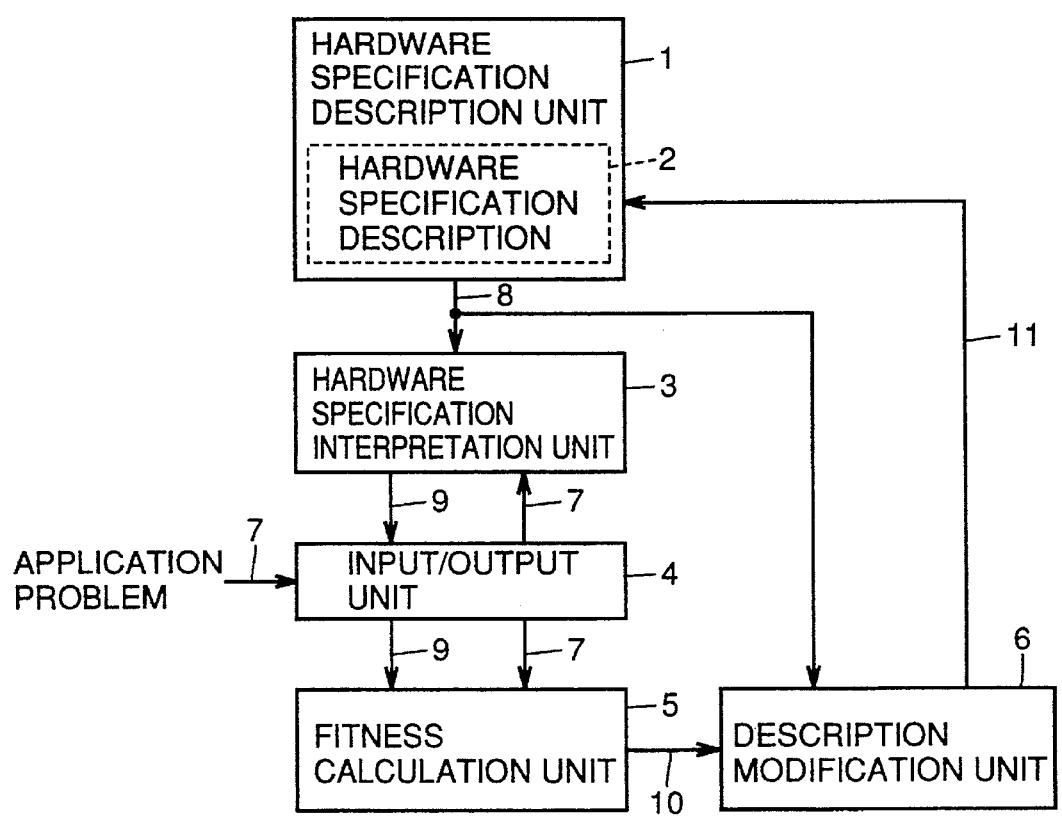
FIG. 1 is a block diagram showing an embodiment of the present invention.
Figure 2:
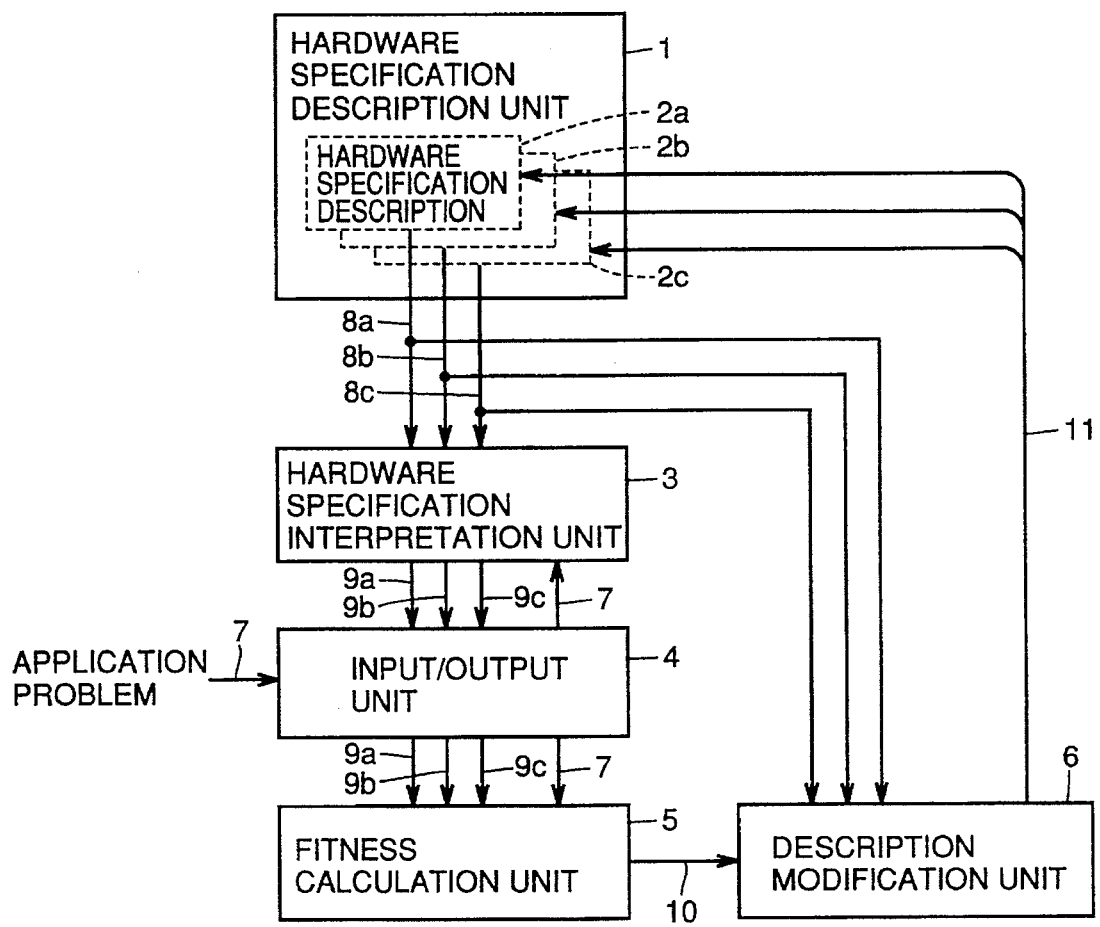
FIG. 2 is a block diagram showing a specific embodiment of the present invention.
Figures 3, 4:
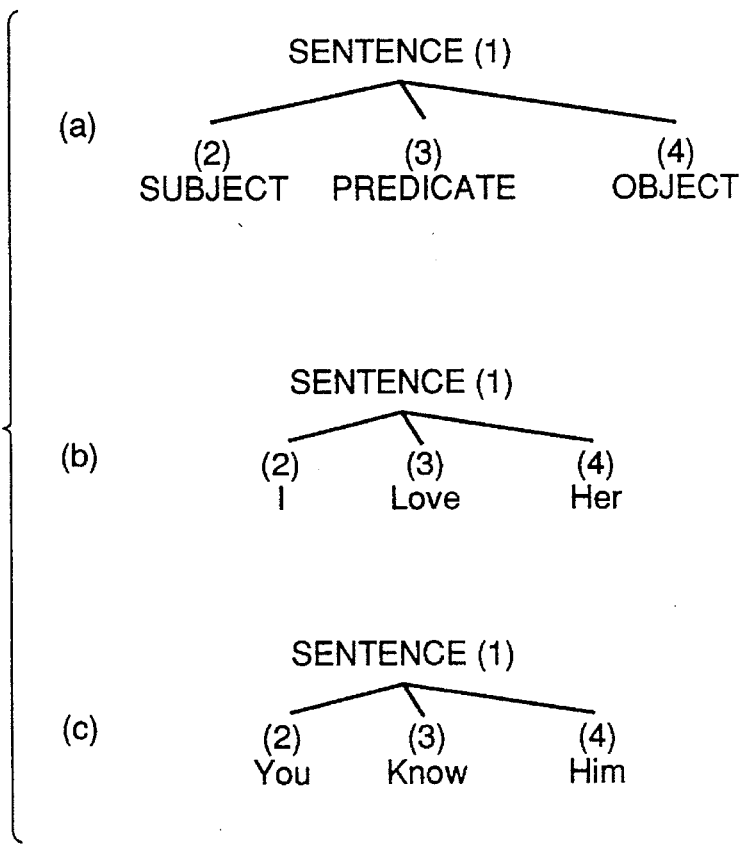
FIG. 3 shows a hardware specification description according to a hardware description language.
FIG. 4 is a diagram for describing equivalent grammar replacement.

In a hardware specification description unit 1 shown in FIGS. 1 and 2, a description as shown in FIG. 3 is processed. Prior to a description of the entire autonomous evolution type hardware design system of FIGS. 1 and 2, a hardware specification description of FIG. 3 will be described.

Referring to FIG. 3, first the elements used in a hardware circuit are declared. The portion sandwiched by a Component Declaration Begin and a Component Declaration End is the declaration of the elements. In the example of FIG. 3, a terminal called "in1" is declared as an input terminal. A terminal called "out1" is declared as an output terminal. Also, an element called "counter" is declared as a register. The declaration of "Model" in the next line implies that an existing hardware circuit will be used as a macro. In the present example, declaration is made that a hardware circuit in the form of "INCREMENT" will be used under the name of "incr1".

In the portion sandwiched by the Operation Definition Begin and Operation Definition End, the desired operation of the hardware is described. In the present example, the content of input terminal "in1" is entered into the register called "counter". Using the output of that register as an input, the INCREMENT type hardware circuit named "incr1" is operated. The output thereof is applied to "counter", and the content of "counter" is provided to output terminal "out1".

Although the example of FIG. 3 shows a hardware circuit described by an operation of a higher level according to a hardware description language, the hardware may be described by the transistor level or the gate level. The autonomous evolution type hardware design system of FIG. 1 is not dependent upon the hardware description language.

An embodiment of an autonomous evolution type hardware design system will be described hereinafter with reference to FIG. 1. Hardware specification description unit 1 includes a memory in which a hardware specification description 2 for describing a specification of a hardware is written. Hardware specification description 2 is applied to a hardware specification interpretation unit 3 via a signal line 8 and to a description modification unit 6. An input/output unit 4 is provided to input a signal 7 representing an application problem to hardware specification interpretation unit 3. Here, an application problem refers to an object to be achieved by the hardware which is now being created. Input/output unit 4 provides the input signal representing the input application problem to hardware specification interpretation unit 3 and to fitness calculation unit 5 via signal line 7. Hardware specification interpretation unit 3 calculates an operation result representing how the actual hardware obtained by hardware specification description 2 operates with respect to the application problem according to signal 7 representing the application problem entered from input/output unit 4 and the content of hardware specification description 2 entered by a signal 8 provided from hardware specification description unit 1. Hardware specification interpretation unit 3 provides a signal 9 representing the operation result thereof to input/output unit 4. Input/output unit 4 provides signal 9 representing the operation result to fitness calculation unit 5. Fitness calculation unit 5 calculates a fitness representing how much signal 9 representing the operation result of the specification description 2 fits signal 7 which represents the application problem. A signal 10 representing the fitness evaluation of the calculation result is entered into description modification unit 6.

Description modification unit 6 modifies the current hardware specification description 2 on the basis of signal 10 which is a fitness evaluation thereof to automatically produce a new specification description. This is provided to hardware specification description unit 1 as a signal 11. The content which is output as signal 11 becomes the new content for hardware specification description 2. During this automatic production of a new specification description, replacement of a description that is grammatically equivalent is used which will be described afterwards. Using the new specification description applied to hardware specification description 2 by the newly generated signal 11 from description modification unit 6, and repeating execution of the above-described operation, a hardware specification description gradually having a higher fitness with respect to the application problem is produced, resulting in an eventual specification description that realizes a hardware completely satisfying the application problem.

Replacement of the specification description with a description grammatically equivalent will be described hereinafter. A specification description is a sentence described using a hardware description language. Therefore, the specification description must satisfy the grammar of the employed hardware description language. If an arbitrary modification is applied to the specification description without providing any particular scheme, the possibility of obtaining a grammatically correct description as the result is low. The object of obtaining a specification description that has a higher fitness with respect to the application problem cannot be achieved. Thus, a scheme is introduced in the modification of the specification description in which a portion of the specification description is replaced by a partial description that is grammatically equivalent to the certain partial description. By introducing this scheme, a meaningful specification description that is grammatically correct can be obtained in the modification of the specification description by description modification unit 6 without producing a meaningless description that is grammatically improper.

Referring to FIG. 4, replacement with a grammatically equivalent description will be described taking English as an example. FIG. 4(*a*) is a grammar of English. For the sake of simplicity, grammar of a sentence including only the subject, the predicate, and the object shown in FIG. 4(*a*) will be considered. Sentences described according to the grammar of FIG. 4(*a*) are shown in (*b*) and (*c*) in FIG. 4. Assuming that FIG. 4(*a*) is the grammar of the hardware description language, (*b*) and (*c*) of FIG. 4 can be referred to as the specification description of the hardware. The description at the positions labeled as (1), (2), (3) and (4) in FIG. 4 can be considered as respective descriptions equivalent in grammar. Even if the descriptions with the same position number denoted are exchanged between (*b*) and (*c*) in FIG. 4, the resultant sentence is a complete proper sentence satisfying the grammar of (*a*) of FIG. 4. For example, "Her" of (*b*) in FIG. 4 and "Him" of (*c*) in FIG. 4 are grammatically equivalent to each other, and the two sentences of:

I Love Him.

You Know Her.

obtained by replacement thereof are proper sentences satisfying the grammar of FIG. 4(a). If "Love" of FIG. 4(b) is replaced by "Like" which is grammatically equivalent, the resulting sentence:

I Like Him.

is a proper sentence satisfying the grammar of FIG. 4(a).

The scheme of equivalent grammar replacement described with reference to FIG. 4 is used in modifying the hardware specification description in description modification unit 6 of FIG. 1.

A more specific embodiment of an autonomous evolution type hardware design system will be described hereinafter with reference to FIG. 2. Hardware specification description unit 1 includes a plurality of hardware specification descriptions, for example three hardware specification descriptions of 2a, 2b and 2c. Each of hardware specification descriptions 2a, 2b and 2c is connected to hardware specification interpretation unit 3 and description modification unit 6 via signals 8a, 8b, and 8c, respectively. As in FIG. 1, hardware specification interpretation unit 3 of FIG. 2 calculates an operation result representing how each actual hardware obtained by each of specification descriptions 2a, 2b and 2c operate with respect to the application problem according to signal 7 representing the application problem entered from input/output unit 4 and the contents of hardware specification descriptions 2a, 2b and 2c entered via signals 8a, 8b and 8c, respectively. Signals 9a, 9b and 9c indicating respective operation results are provided to input/output unit 4. Fitness calculation unit 5 receives signals 9a, 9b and 9c representing respective operation results of each of specification descriptions 2a, 2b, 2c from input/output unit 4, and also signal 7 representing the application problem. Fitness calculation unit 5 calculates a fitness representing how much signals 9a, 9b and 9c representing the operation results of specification descriptions 2a, 2b and 2c fit the application problem provided via signal 7. Signal 10 representing the fitness evaluation which is the calculation result is applied to description modification unit 6 as an output of fitness calculation unit 5.

Description modification unit 6 modifies the current specification descriptions 2a, 2b and 2c on the basis of signal 10 which is a fitness evaluation thereof to automatically generate a plurality of (in this case 3) new specification descriptions. The result thereof which is signal 11 becomes the new content of each of hardware specification descriptions 2a, 2b and 2c. During this automatic generation of a new specification description, genetic algorithms which will be described afterwards are used.

By repeating the execution of the operation of FIG. 1 using the new specification descriptions applied to hardware specification descriptions 2a, 2b and 2c by signal 11 which is newly generated by description modification unit 6, a specification description gradually having a higher fitness with respect to the application problem is generated. Eventually, a specification description that realizes a hardware completely satisfying the application problem can be obtained.

The above-described operation can be executed more speedily by preparing a plurality of hardware specification interpretation units 3, input/output units 4, and fitness calculation units 5 shown in FIG. 2, and operating the same in parallel.

Signals 9a, 9b and 9c may be directly applied to fitness calculation unit 5 from hardware specification interpretation unit 3 without passing through input/output unit 4 according to the application problem.

Figure 5:
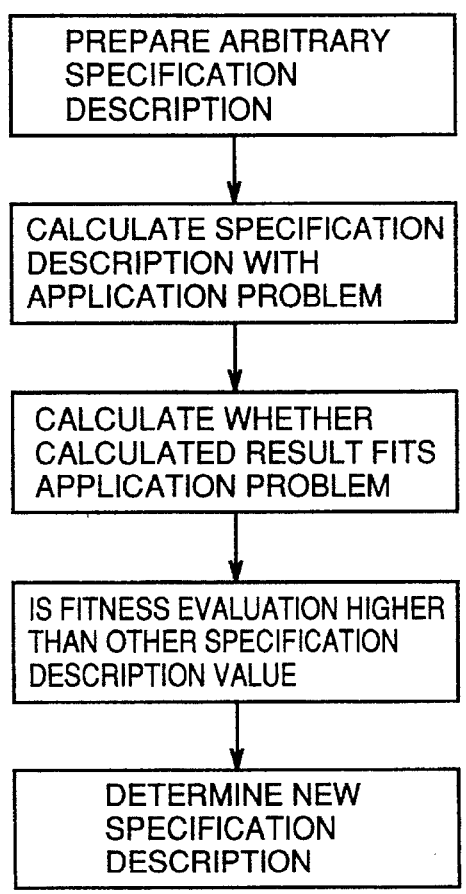
FIG. 5 is a flow chart for describing operation of genetic algorithms.
Figure 6:
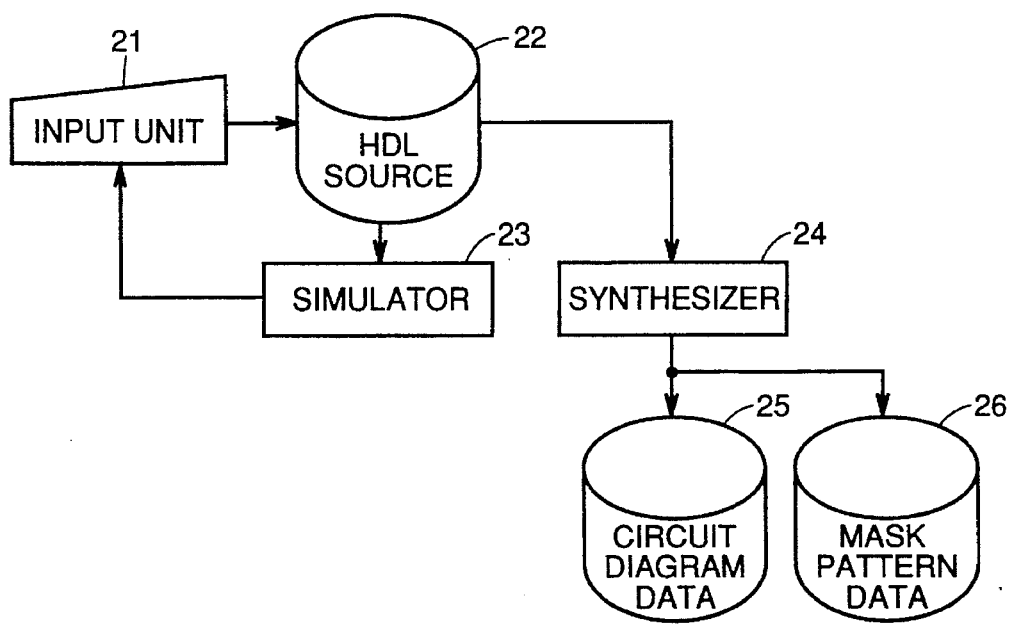
FIG. 6 is a block diagram for describing a conventional computer aided design (CAD) system of an electronic circuit.

FIG. 5 is a flow chart indicating genetic algorithms. The operation of genetic algorithms will be described with reference to FIGS. 2 and 5. First, arbitrary hardware specification descriptions, for example hardware specification descriptions 2a, 2b and 2c, are prepared. Hardware specification descriptions 2a, 2b and 2c are applied to hardware specification interpretation unit 3 via signals 8a, 8b and 8c, respectively, and also to description modification unit 6. At the same time, signal 7 representing the application problem is applied to hardware specification interpretation unit 3 from input/output unit 4. Hardware specification description unit 3 carries out calculation according to hardware specification descriptions 2a, 2b and 2c and the application problem to provide respective operation results of each actual hardware to input/output unit 4 as signals 9a, 9b and 9c. Operation resultant signals 9a, 9b and 9c are provided to fitness calculation unit 5 with signal 7 representing the application problem. Fitness calculation unit 5 calculates how much each of hardware specification descriptions 2a, 2b and 2c fits the application problem. The result thereof is applied to description modification unit 6 by signal 10 as fitness evaluation thereof.

In description modification unit 6, new hardware specification descriptions 2a, 2b and 2c are determined on the basis of a specification description having a fitness evaluation higher than that of other specification descriptions, i.e., that is more suitable with respect to the application problem. In this process, a scheme is used of grammatically equivalent replacement of the specification description. Using the obtained new hardware specification descriptions 2a, 2b and 2c, and carrying out the above-described operation, specification interpretation and evaluation processes are carried out. By repeating such processes, the specification description will become more suitable for the application problem.

By using the above-described genetic algorithms, parallel operation of approximately $N^3$ (N is the number of specification descriptions) that is latently generated by genetic algorithms can be carried out. Therefore a hardware specification description suitable for the application problem can be obtained more speedily. Because a plurality of specification descriptions are processed simultaneously with the genetic algorithms, it is possible to maintain various specification descriptions. A plurality of efficient specification descriptions can be obtained with respect to one application problem. In other words, a plurality of circuits differing in architecture can be prepared. By virtue of its variety, a hardware specification can be generated speedily that fits the application problem even in the case where the application problem per se causes change.

Thus, according to the embodiment of the present invention, a specification of a described hardware is interpreted to generate an operation of that hardware. A fitness is calculated for the case where the hardware is used that is produced from the operation thereof and the required operation specification. The specification of the hardware is modified with reference to the fitness. Therefore, a hardware that carries out an operation suitable for its object of usage can be designed in an autonomous and evolutional manner. An optimum hardware for its object of usage can be obtained by selecting automatically from a plurality of design examples of various architectures.

The present invention is not limited to operation of a hardware, and is applicable to experimental systems of the manner and behavior of artificial creatures that are described by automata, and for the operation simulation of autonomous parallel process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An autonomous evolutional type hardware specification system for designing a hardware of an electronic circuit, said autonomous evolution type hardware design system comprising:

hardware specification description means for describing a specification of a hardware, hardware specification interpretation means for interpreting a specification described by said hardware specification description means to produce an operation of that hardware, fitness calculation means for calculating a fitness in using a consequent hardware according to an operation of the hardware generated by said hardware specification interpretation means and a required operation specification, and description modification means referring to a fitness calculated by said fitness calculation means for modifying a description of the hardware in said hardware specification description means.

2. The autonomous evolution type hardware design system according to claim 1, wherein said hardware specification description means comprises means for expressing a specification of said hardware using a hardware description language.

3. The autonomous evolution type hardware design system according to claim 1, wherein said description modification means comprises means for replacing a portion of the hardware specification description by said hardware description language with a description that is grammatically equivalent to said portion.

4. The autonomous evolution type hardware design system according to claim 1, wherein said hardware specification description means describes a plurality of hardware specifications, and wherein said description modification means modifies the description using genetic algorithms on the basis of a fitness of said plurality of hardware specifications.

5. The autonomous evolution type hardware design system according to claim 1, further comprising:

input means for applying information representing an application problem to said hardware specification interpretation means and said fitness calculation means, wherein said hardware specification interpretation means comprises means for calculating an operation result representing how an actual hardware obtained by said hardware specification description operates with respect to the application problem according to the information representing the application problem applied from said input means, and the specification described by said hardware specification description, wherein said fitness calculation means comprises means for calculating a fitness representing how much said calculated operation result fits said application problem, and providing the calculation result to said description modification means.

6. The autonomous evolution type hardware design system according to claim 5, wherein said description modification means comprises means for modifying the current hardware specification description according to the calculation result calculated by said fitness calculation means.

* * * * *